(12) United States Patent
Furuta et al.

(10) Patent No.: US 7,274,616 B2
(45) Date of Patent: Sep. 25, 2007

(54) INTEGRATED CIRCUIT APPARATUS

(75) Inventors: Hiroshi Furuta, Kanagawa (JP);
Kenjyu Shimogawa, Kanagawa (JP);
Ichirou Mizuguchi, Kanagawa (JP);
Junji Monden, Kanagawa (JP); Shinji Takeda, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/322,425

(22) Filed: Jan. 3, 2006

(65) Prior Publication Data
US 2006/0164905 A1 Jul. 27, 2006

(30) Foreign Application Priority Data
Jan. 7, 2005 (JP) ............................. 2005-003124

(51) Int. Cl.
*G11C 5/14* (2006.01)
*G11C 7/00* (2006.01)
(52) U.S. Cl. .................................. 365/226; 365/189.07
(58) Field of Classification Search ................ 365/154, 365/226, 49, 189.07
See application file for complete search history.

(56) References Cited

U.S. PATENT DOCUMENTS 6,618,281 B1 * 9/2003 Gordon ........................ 365/49
7,092,281 B1 * 8/2006 Aipperspach et al. ....... 365/154
2003/0156454 A1 * 8/2003 Wei et al. ............... 365/185.17

FOREIGN PATENT DOCUMENTS

| JP | 61-67952 | 4/1986 |
|----|----------|--------|
| JP | 7-234799 | 9/1995 |
| JP | 8-255872 | 10/1996 |
| JP | 2003-208800 | 7/2003 |

OTHER PUBLICATIONS

T. Calin et al., IEE Transactions on Nuclear Science, Dec. 1995, vol. 42, No. 6, pp. 1592-1598.

* cited by examiner

*Primary Examiner*—Son Dinh
(74) *Attorney, Agent, or Firm*—McGinn IP Law Group, PLLC

(57) ABSTRACT

An integrated circuit apparatus includes a SRAM cell array having a plurality of memory cells formed of CMOSFET arranged lattice-like. The SRAM cell array has a pair of power line and ground line in each of 1-bit sequences. The integrated circuit apparatus also includes a detector detecting the occurrence of latch-up for each 1-bit sequence and outputting a detection signal, and a power controller controlling a power supply voltage to the power line for each 1-bit sequence. The power controller reduces a voltage to be supplied to the power line in the 1-bit sequence where latch-up is occurring down to a predetermined value according to the detection signal.

19 Claims, 6 Drawing Sheets

INTEGRATED CIRCUIT APPARATUS

BACKGROUND OF THE INVENTION

1. Field of the Invention

The present invention relates to an integrated circuit apparatus having an SRAM cell array formed of CMOSFET and, particularly, to an integrated circuit apparatus capable of reducing the effects of latch-up that occurs in an SRAM cell array.

2. Description of Related Art

An integrated circuit having a complementary metal oxide semiconductor field effect transistor (CMOSFET) is susceptible to latch-up that an abnormal current flows between a power supply and a ground of the integrated circuit, caused by a parasitic bipolar transistor with a thyristor structure in CMOSFET turning ON upon application of an overvoltage to an input/output terminal or the like.

The reduction in a power supply voltage with miniaturization of an integrated circuit and the implementation of shallow trench isolation (STI) for device isolation have contributed to the improvement in latch-up resistance. At the same time, since a PN isolation interval decreases due to the miniaturization of an integrated circuit, the ability of a parasitic bipolar transistor that causes latch-up increases and therefore the problem of latch-up still remains. Further, since a gate length of MOSFET also decreases like in the parasitic bipolar, snap-back behavior is also likely to occur at a low voltage.

The problem of latch-up is particularly serious in an SRAM cell array that is composed of CMOS memory cells with a low density of a well potential contact and a substrate potential contact. Occurrence of latch-up in the SRAM cell array leads to not only breakdown of the data stored in the memory cell but also hard errors if the latch-up is left unsolved.

Technologies to prevent latch-up from occurring involve the followings. Approaches in layout technology include increasing the density of a well potential contact and a substrate potential contact, enlarging a PN isolation interval, and so on.

Approaches in device process technology include increasing impurity concentration, reducing electric resistance of a well and a substrate through optimization of an impurity profile, and so on. Other approaches use a P on P+ epitaxial wafer or Silicon on Insulating Substrate (SIS).

Further, approaches in circuit technology include placing a mechanism for blocking power supply in the event of latch-up in order to prevent hard errors from occurring due to latch-up. This technique is described in Japanese Unexamined Patent Publication No. 61-67952, 07-234799, 08-255872, for example.

Japanese Unexamined Patent Publication No. 61-67952 discloses a CMOS semiconductor apparatus that has resistance control means to detect the occurrence of latch-up and limit the supply of a power supply current. Upon detecting the occurrence of latch-up, the apparatus increases the resistance value of a resistor in a power supply circuit to place limitation on power supply current, thereby preventing large current from flowing into the circuit.

Japanese Unexamined Patent Publication No. 07-234799 discloses a latch-up protector that has a voltage controller for controlling the voltage for driving a load upon occurrence of latch-up.

Japanese Unexamined Patent Publication No. 08-255872 discloses an integrated circuit apparatus that divides an integrated circuit into functional blocks and places a latch-up detector in each of the divided functional blocks.

Besides the above techniques, a technique for avoiding the occurrence of latch-up in SRAM is described in Japanese Unexamined Patent Publication No. 2003-208800. Specifically, this technique supplies different voltages to a memory cell region and a peripheral circuit region in burn-in test of a semiconductor memory device so as to prevent the memory cell from breakdown due to the occurrence of latch-up during the burn-in test.

Further, T. Calin et al., IEEE TRANSACTIONS ON NUCLEAR SCIENCE, December 1995, Vol. 42, No. 6, pp. 1592-1598 discloses a technique of placing a circuit for detecting a weak current that occurs due to bit inversion in a memory cell in the event of soft errors in an SRAM cell array in each 1-bit sequence of the cell array.

The present invention, however, has recognized that the above techniques have the following problems. If latch-up occurs in an SRAM cell array, the effects of latch-up spread to all of a plurality of memory cells that receive power supply from a pair of power line and ground line. Thus, even if hard errors are avoided by placing a detector between the power line and ground line to detect latch-up and blocking power supply, data of the entire memory cells affected by latch-up can be lost. For example, in a conventional SRAM cell array, a pair of power supply line and ground line is placed in every 8-bit sequence. If latch-up occurs in such a cell array, the data retained in the entire memory cells of the 8-bit sequence supplied with power through the pair of power supply line and ground line is lost.

SUMMARY OF THE INVENTION

To there ends, according to an aspect of the present invention, there is provided an integrated circuit apparatus that includes a static random access memory (SRAM) cell array including a plurality of memory cells formed of complementary field effect transistors arranged lattice-like, a detector detecting a change in a current flowing between a power supply and a ground or a voltage between a power supply and a ground of each 1-bit sequence of the SRAM cell array and outputting a detection signal, and a power controller controlling a power supply voltage for each 1-bit sequence. The power controller reduces a power supply voltage supplied to a 1-bit sequence where a change in the current or the voltage is detected by the detector down to a predetermined value according to the detection signal.

According to another aspect of the present invention, there is provided an integrated circuit apparatus that includes a static random access memory (SRAM) cell array including a plurality of memory cells formed of complementary field effect transistors arranged lattice-like, a power line placed in each 1-bit sequence of the SRAM cell array, a detector detecting occurrence of an effect of a parasitic bipolar transistor or a snap-back effect that is similar thereto for each 1-bit sequence and outputting a detection signal, and a power controller controlling a voltage to be supplied to the power line for each 1-bit sequence. The power controller reduces a voltage to be supplied to the power line placed in a 1-bit sequence where the occurrence of an effect of a parasitic bipolar transistor or a snap-back effect that is similar thereto is detected by the detector down to a predetermined value according to the detection signal.

In the SRAM cell, it is preferred that the range of memory cells that is affected by the effect of a parasitic bipolar element such as latch-up or a snap-back effect similar thereto is as small as possible. It is further preferred that the range of memory cells that is affected by the effect of a parasitic bipolar element or the snap-back effect similar thereto is limited to the range where lost data can be recovered by Error Check and Correct (ECC) processing. This is because a cell array can be restored to the state prior to the occurrence of latch-up without data rewrite if the data lost by latch-up is recovered by the ECC processing that is used conventionally for recovering soft errors.

The integrated circuit apparatus of the present invention having the above configuration can limit the range that is affected by the effect of a parasitic bipolar element such as latch-up or a snap-back effect similar thereto to the range of a 1-bit sequence of the SRAM cell array. Further, since it is possible to limit the range where data is lost due to the effect of a parasitic bipolar element such as latch-up or a snap-back effect similar thereto, it facilitates the recovery of lost data by ECC processing.

According to still another aspect of the present invention, there is provided an integrated circuit apparatus that includes a static random access memory (SRAM) cell array including a plurality of memory cells formed of complementary field effect transistors arranged lattice-like, and an error corrector recovering lost data by error correction processing using an error correction code if data retained by the SRAM cell array is lost due to an effect of a parasitic bipolar transistor or a snap-back effect that is similar thereto in the SRAM cell array.

This configuration allows recovering the data lost by the effect of a parasitic bipolar device such as latch-back or a snap-back effect similar thereto by ECC processing. It is therefore possible to avoid the affect of data loss due to latch-up or other effects of a parasitic bipolar device or a snap-back effect in an integrated circuit apparatus having an SRAM cell array formed of CMOSFET.

The present invention can reduce the effects of data loss due to latch-up or other effects of a parasitic bipolar device or a snap-back effect of MOSFET that is similar thereto in an integrated circuit apparatus having an SRAM cell array formed of CMOSFET.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
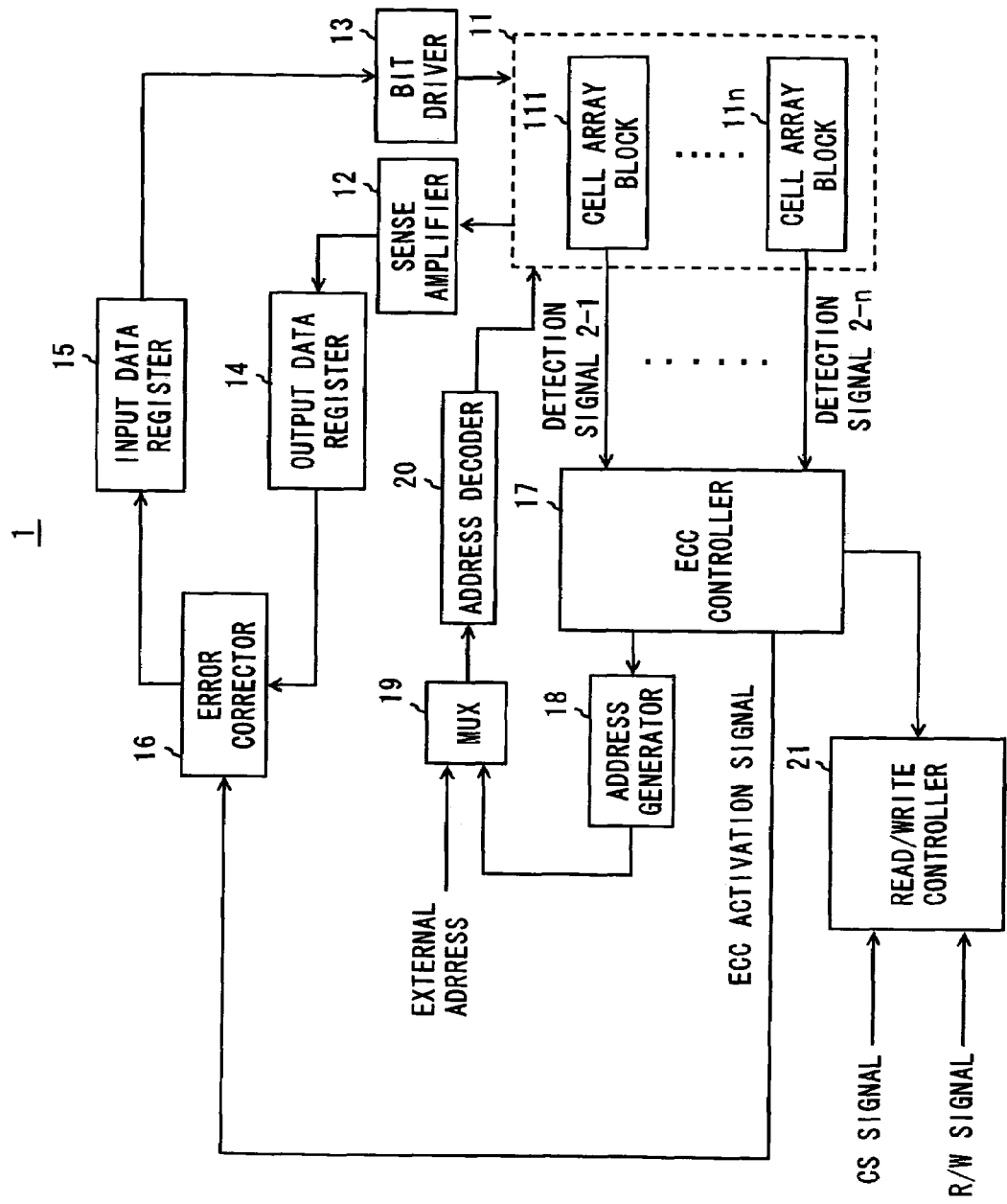
FIG. 1 is a block diagram of an integrated circuit apparatus according an embodiment of the invention.

FIG. 1 shows the configuration of an integrated circuit apparatus 1 according to an embodiment of the present invention. A cell array 11 is an SRAM cell array where memory cells formed of CMOSFET are arranged lattice-like. The cell array 11 is divided into one or a plurality of cell array blocks 111 to 11n. Each of the cell array blocks has a configuration where memory cells are arranged lattice-like, and each memory cell is connected to a word line (row selection line) and a bit line (column selection line). The detailed configuration of the cell array block 111 of this embodiment is described later. A sense amplifier 12 and a bit driver 13 are connected to a bid line of the cell array 11. In data reading, the sense amplifier 12 detects and amplifies information of the memory cell and stores the read data into an output data register 14. In data writing, the bid driver 13 is driven according to information of input data register 15 and writes data to the memory cell.

The output data register 14 stores data read out from the cell array 11. The input data register 15 retains data to be written to the cell array 11. An address decoder 20 selects a word line and a bit line corresponding to a memory cell specified by input address information. A read/write controller 21 controls read/write operation on the cell array 11 according to a chip select (CS) signal input from outside, a R/W signal to indicate the implementation of read/write operation and so on.

An ECC controller 17 specifies the recovery of data that is lost by latch-up upon occurrence of latch-up in the cell array 11. An address generator 18 generates an address of a cell array block where latch-up is occurring. A MUX 19 is a multiplexer for supplying either one of an external address input from outside or an address generated by the address generator 18 to an address decoder 20 when performing normal read/write operation. An error corrector 16 recovers the data lost by latch-up according to an ECC activation signal supplied from the ECC controller 17.

Figure 2:
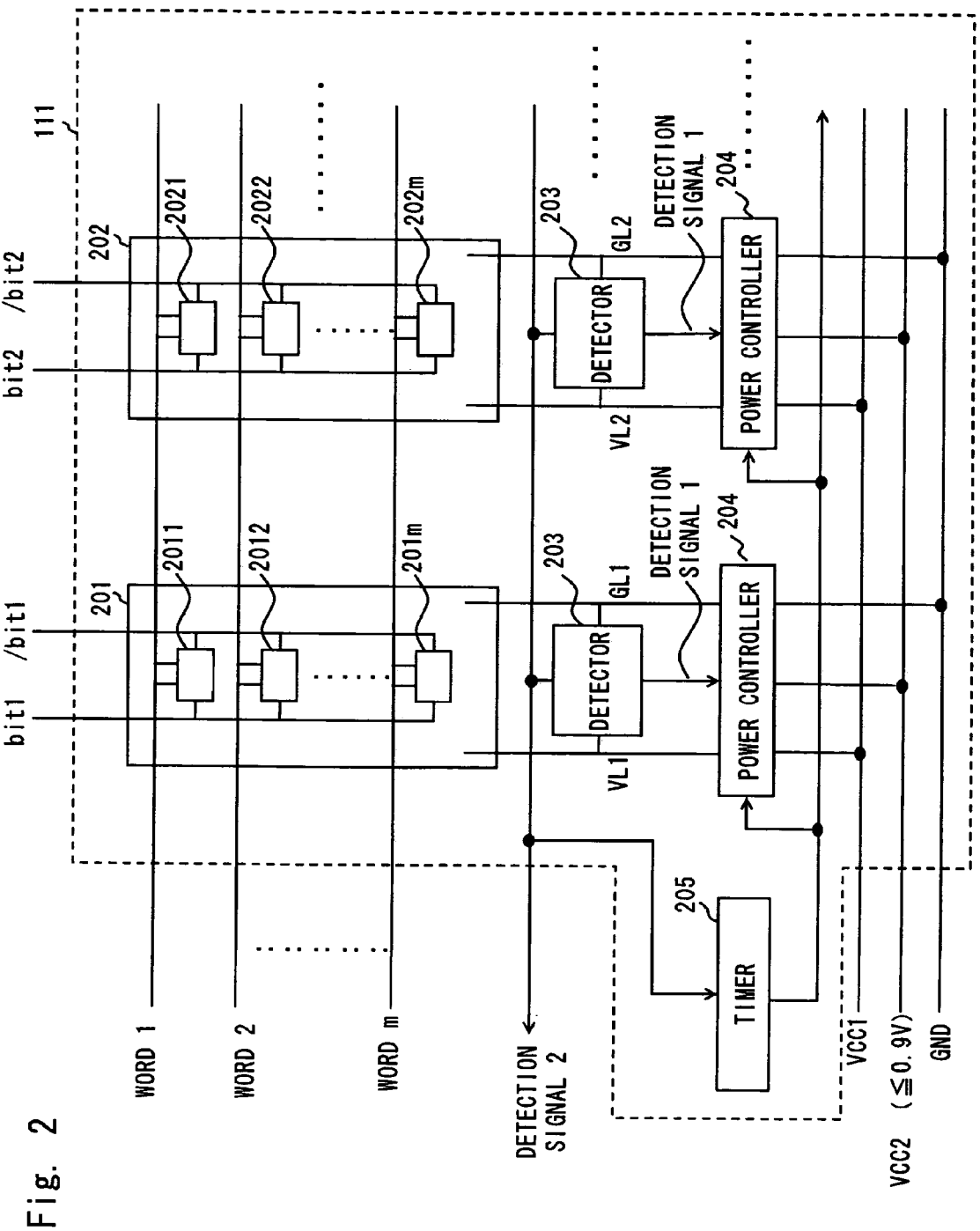
FIG. 2 is a block diagram of a cell array block included in an integrated circuit apparatus according an embodiment of the invention.

The configuration of the cell array block 111 is described hereinafter in detail with reference to FIGS. 2 to 4. FIG. 2 shows the configuration of an SRAM cell array block 111 according to an embodiment of the invention. The cell array block 111 has a configuration where a plurality of memory cells formed of CMOSFET are arranged lattice-like. A 1-bit sequence 201 includes memory cells 2011 to 201m. The memory cells 2011 to 201m are commonly connected to a bit line bit1 and/bit1. Each memory cell is connected one of word lines word1 to wordm. The 1-bit sequence 201 operates with a power supply voltage VCC1 that is supplied through a power supply line VL1 and a ground linne GL1. A 1-bit sequence 202 has the same configuration as the 1-bit sequence 201. A plurality of these 1-bit sequences are arranged to form one cell array block 111.

A detector 203 detects the occurrence of latch-up in the 1-bit sequence 201. Upon detecting the occurrence of latch-up, the detector 203 supplies a detection signal 1 to a power controller 204 and supplies a detection signal 2 to a timer 205 and the ECC controller 17. The occurrence of latch-up can be detected by monitoring a voltage change between the power line VL1 and the ground line GL1, for example.

Figure 3:
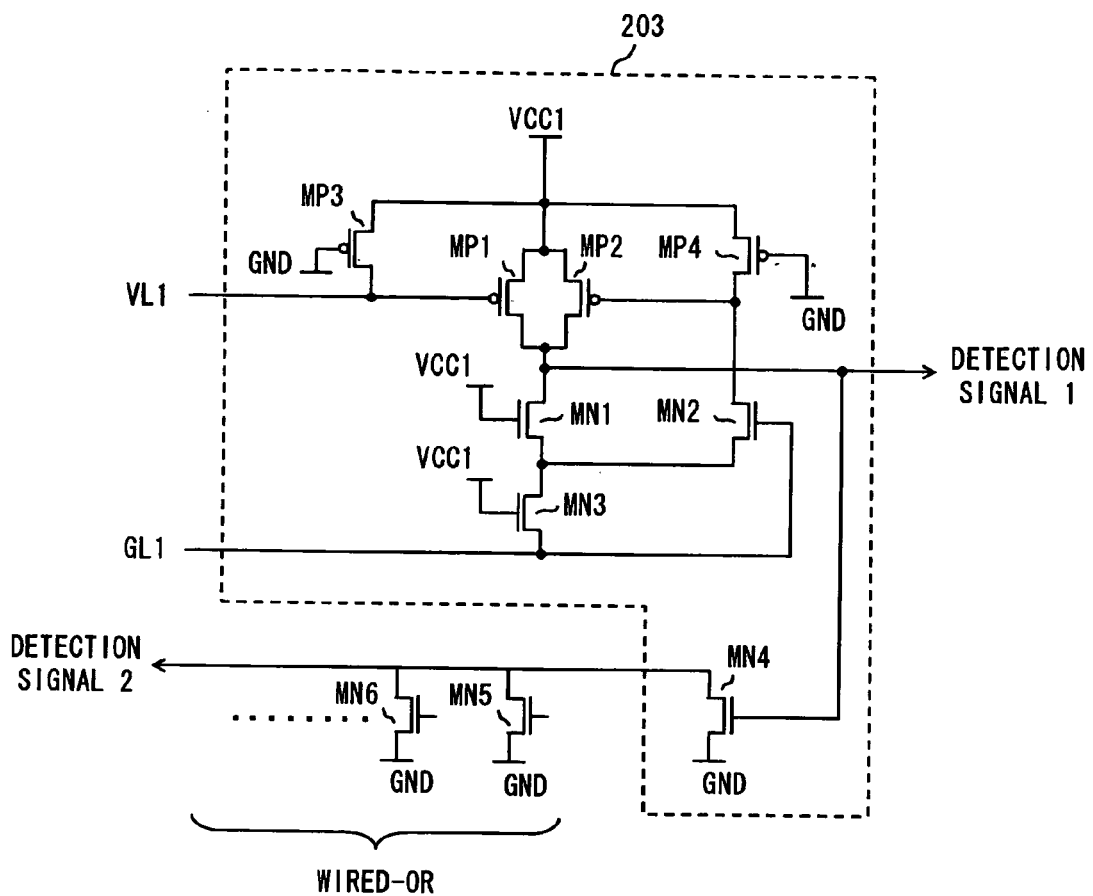
FIG. 3 is a view showing a configuration example of a detector included in an integrated circuit apparatus according an embodiment of the invention.
Figure 4:
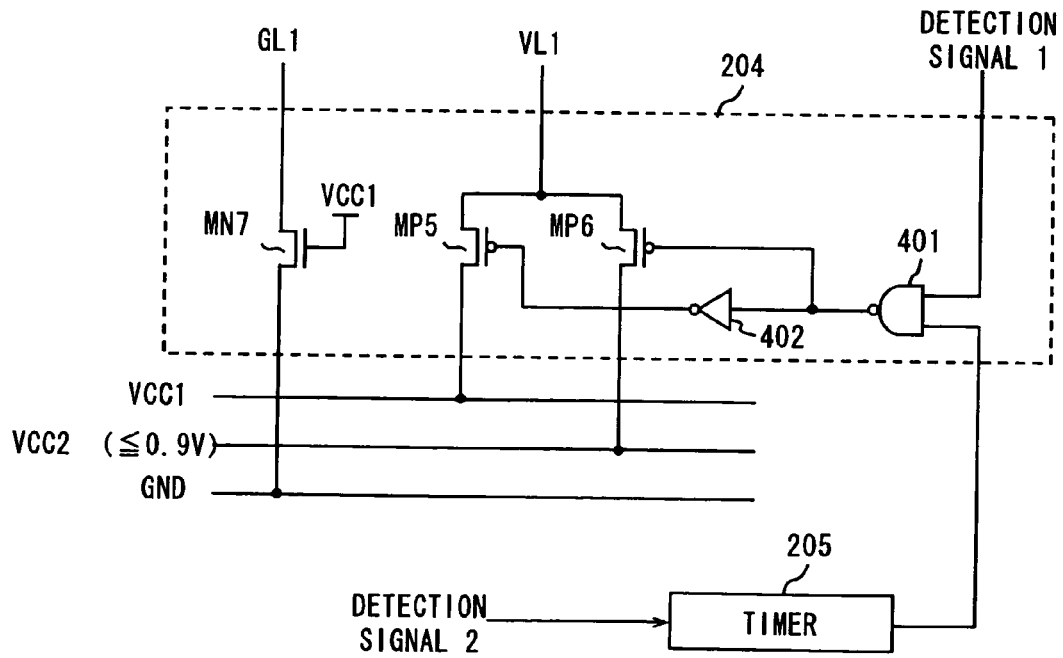
FIG. 4 is a view showing a configuration example of a power controller included in an integrated circuit apparatus according an embodiment of the invention.

FIG. 3 is a configuration example of the detector 203. Since the voltage of VL1 decreases and the voltage of GL1 increases when latch-up occurs in the 1-bit sequence 201, the occurrence of latch-up can be recognized by detecting this voltage change. Specifically, when the voltage of VL1 decreases, a Pch transistor MP1 turns ON and outputs a detection signal 1 as High level (VCC1 voltage) state. Further, an Nch transistor MN4 receives the detection signal 1 through its gate and outputs the detection signal 2 as Low level (ground GND voltage) state through its drain. When the voltage of GL1 increases, an Nch transistor MN2 turns ON and the gate voltage of a Pch transistor MP2 thereby decreases to turn ON and outputs the detection signal 1 as High level (VCC1 voltage) state. The detection signal 2 is thus output as Low level (ground GND voltage) state. The detection signal 2 is wired-OR connected to Nch transistors MN5 and MN6 included in another detector circuit. If the detection signal 2 is output from any of the plurality of detectors 203, this signal is supplied to the ECC controller 17.

Referring back to FIG. 2, the power controller 204 controls a power supply voltage to be supplied to the bit sequence 201. When no latch-up occurs, the power controller 204 supplies a voltage VCC1 required for the bit sequence 201 to perform normal data retaining operation to the power line VL1 and supplies a ground voltage GND to the ground line GL1. When the power controller 204 receives the detection signal 1 from the detector 203 that has detected the occurrence of latch-up, it changes the voltage to be supplied to the power line VL1 into VCC2.

The timer 205 informs the power controller 204 of the timing to set the voltage to be supplied to the power line VL1 back from VCC2 to VCC1. When a predetermined time period has passed since the timer 205 receives the detection signal 2 from the detector 203, the timer 205 indicates the reset of the power supply voltage to the power controller 204. The predetermined time period after input of the detection signal 2 is determined so as to be sufficient to eliminate latch-up that has occurred in the 1-bit sequence 201 by reducing the power supply voltage to VCC2.

The voltage VCC2 is a latch-up elimination voltage that is predetermined as a voltage value to eliminate latch-up. A conventional technique for eliminating latch-up blocks power supply to cut the power supply voltage to zero. The present invention determines the voltage value of VCC2 as follows. Latch-up occurs when two parasitic bipolar transistors in CMOSFET turn ON. The bipolar transistor turns ON if the base-emitter is forward biased. The bias voltage at this time is generally a forward voltage of a diode that forms the base-emitter of the bipolar transistor, which is about 0.6V. Thus, elimination of latch-up at least needs to satisfy the following expression:

$$VCC2 < Vf(PNP) + Vf(NPN) \approx 1.2V$$

where Vf(PNP) and Vf(NPN) are base-emitter forward voltages of two parasitic bipolar transistor, which are a PNP bipolar transistor and an NPN bipolar transistor, respectively. Since the minimum value of the bias voltage of Vf(PNP) and Vf(NPN) is about 0.6V, the condition represented by the above expression is obtained theoretically.

However, if one bipolar transistor of two parasitic bipolar transistors turns ON, the other bipolar transistor is biased by the collector current of the above bipolar transistor. Thus, latch-up remains in practice even if VCC2 is set lower than 1.2V.

The inventors have conducted experiments under various conditions and found that it is necessary to reduce the power supply voltage VCC2 to 0.9V or lower in order to eliminate latch-up. Since the power supply voltage to eliminate latch-up varies by the impedance of a current path under the occurrence of latch-up, latch-up is eliminated if the power supply voltage VCC2 is set within the range from 0.6V to 0.9V. The lower limit of 0.6V is a voltage value that is required for at least one of the two parasitic bipolar transistors to turn ON.

As described above, a conventional technique cuts a power supply voltage to zero in order to eliminate latch-up. The present invention does not block a power supply voltage but reduces it to a voltage level that eliminates latch-up, thereby allowing a recovery time after elimination of latch-up to be shorter than the conventional configuration.

The configuration and operation of the power controller 204 and the timer 205 are described hereinafter with reference to FIGS. 4 and 5. FIG. 4 shows a configuration example of the power controller 204. A NAND circuit 401 receives the detection signal 1 from the detector 203 through one input terminal and receives the output signal from the timer 205 through the other input terminal. The output of the NAND circuit 401 is supplied to a Pch transistor MP6 and also supplied to a Pch transistor MP5 after being inverted by an inverter 402. The Pch transistors MP5 and MP6 serve as switches for selecting a power supply voltage to the power line VL1 from VCC1 and VCC2.

Figure 5:
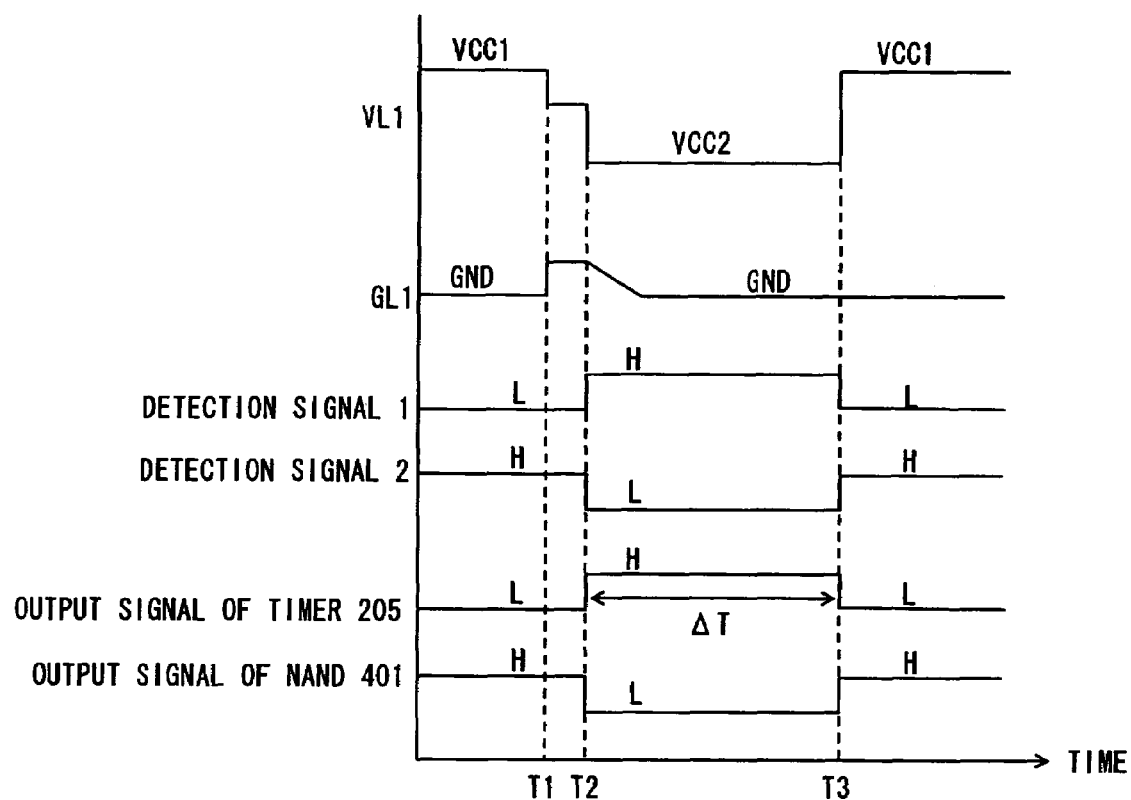
FIG. 5 is a timing chart related to detection of latch-up in a cell array block included in an integrated circuit apparatus according an embodiment of the invention.

FIG. 5 shows a timing chart in detection and elimination of latch-up. Latch-up has not occurred prior to the time T1. Since the detector 203 does not detect latch-up at this time, the detection signal 1 is Low level and the detection signal 2 is High level, and the output of the timer 205 is Low level. Therefore, the output of the NAND circuit 401 is High level, and thereby the Pch transistor MP5 turns ON and the Pch transistor MP6 turns OFF. As a result, a power supply voltage VCC1 to allow the 1-bit sequence 201 to operate normally is supplied to the power line VL1.

When latch-up occurs in the 1-bit sequence 201 at the time T1, the voltage of the power line VL1 decreases and the voltage of the ground line GL1 increases. When the detector 203 detects the voltage change at the time T2, it outputs the detection signal 1 in the High level state and the detection signal 2 in the Low level state. Further, the timer 205 is activated by the input of the detection signal 2 in the Low level state so that its output signal is High level during a predetermined time indicated by ΔT in FIG. 5. The output of the NAND circuit 401 thereby becomes Low level, and the Pch transistor MP5 turns OFF and the Pch transistor MP6 turns ON. As a result, a power supply voltage VCC2 to eliminate latch-up occurring in the 1-bit sequence 201 is supplied to the power line VL1.

At the time T3 when a predetermined time ΔT that is set to be sufficient for eliminating latch-up occurring in the 1-bit sequence 201 has passed since the activation of the timer 205, the output signal of the timer 205 changes into Low level. The voltage supplied to the power line VL1 thereby returns to VCC1. Since latch-up has been eliminated at this time, the detection signal 1 becomes Low level and the detection signal 2 becomes High level, thus returning to the state before the occurrence of latch-up.

This operation allows detecting latch-up occurring in the cell array block 111 for each 1-bit sequence and switching a power supply voltage to a voltage level for eliminating latch-up, thereby eliminating latch-up. It is therefore possible to prevent hard errors that destroy the memory cells constituting the cell array 11. Further, the timer 205 allows a power supply voltage to return to a level VCC1 for normal operation immediately after elimination of latch-up. It is therefore possible to recover the data lost by latch-up speedily.

Figure 6:
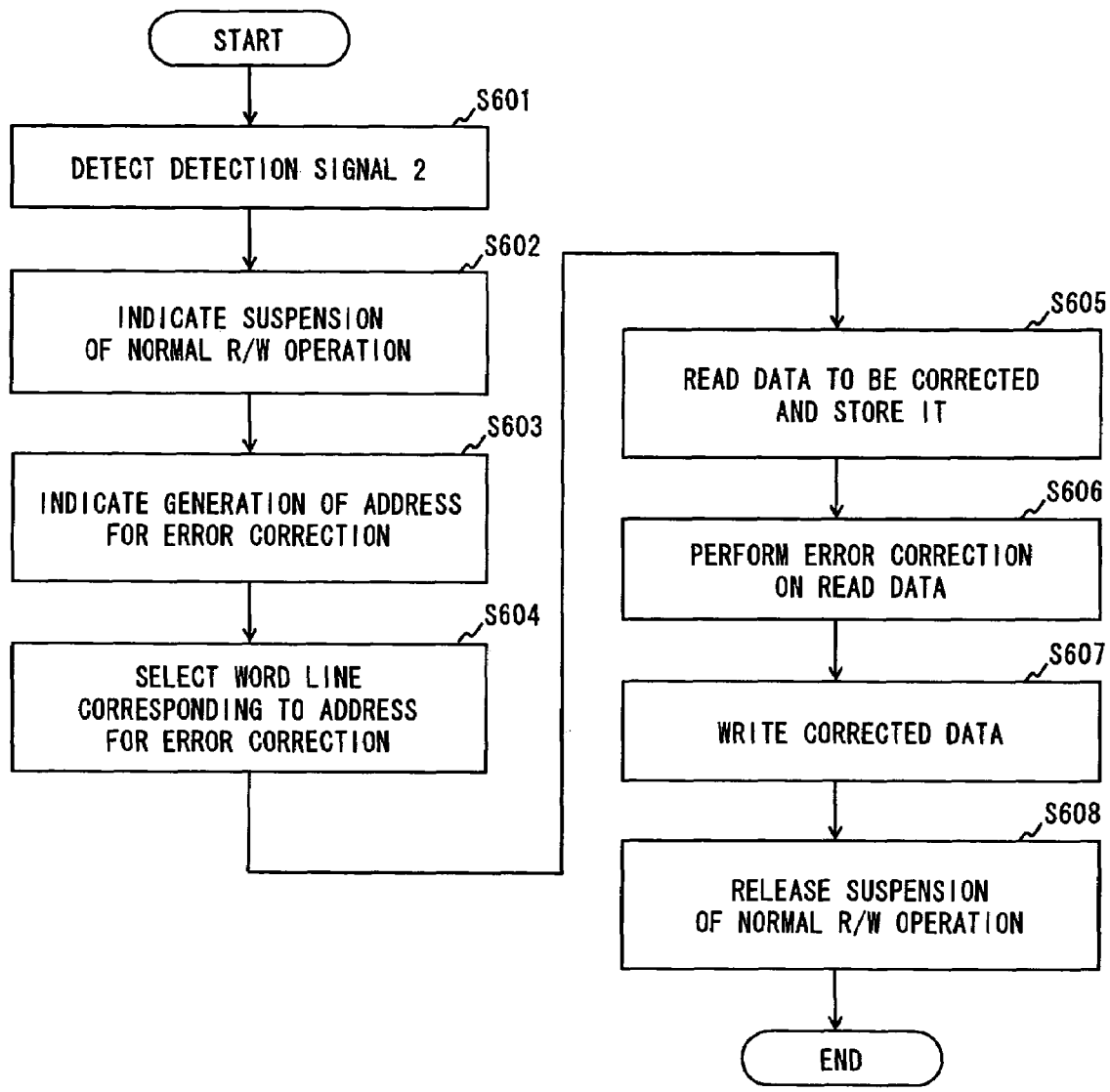
FIG. 6 is a flow chart showing the operation of an integrated circuit apparatus according an embodiment of the invention.

The data recovery operation after the occurrence of latch-up in the integrated circuit apparatus 1 of this embodiment is described hereinafter with reference to the flow chart of FIG. 6. Firstly, the detection signal 2 output from the cell array block where latch-up is occurring is input to the ECC controller 17 (S601). Receiving the detection signal 2, the ECC controller 17 gives a command to suspend the normal read/write operation on the cell array block that has output the detection signal 2 to the read/write controller 21 (S602) Then, the ECC controller 17 gives a command to generate an address of the cell array block in need of error correction to the address generator 18 (S603). The address generator 18 supplies a generated address to the address decoder 20 through the MUX 19. The cell array block in need of error correction is the cell array block that has output the detection signal 2 received by the ECC controller 17.

Then, the address decoder 20 selects a word line that corresponds to the address generated by the address generator 18 (S604). After that, the sense amplifier 12 is driven to read information required for error correction, which includes data to be error-corrected and a redundant bit for error correction, from the cell array 11 and stores it into the output data register 14 (S605). Then, according to an ECC activation signal supplied from the ECC controller 17, the error corrector 16 performs error detection and recovery on the data read out from the cell array 11 (S606). The bit driver 13 is then driven to write the corrected data back to the memory cell whose data has lost due to latch-up (S607). Finally, the ECC controller 17 gives a command to release the suspension of the normal read/write operation that has started in S601 to the read/write controller 21 (S608).

In this way, this operation corrects the data lost by latch-up upon input of the detection signal 2 that is output from the cell array 11 in the event of latch-up, thereby allowing the cell array 11 to return to the state before the occurrence of latch-up.

In a conventional SRAM cell array, a pair of power line and ground line is placed in each 8-bit sequence, for example. If latch-up occurs in such a conventional cell array, the data retained in the entire memory cell of 8-bit sequence that receives power through the pair of power line and ground line is lost. If the retained data is lost in a large scale range, it is impossible to perform error correction by ECC processing.

On the other hand, in the integrated circuit apparatus 1 of this embodiment, a pair of power line and ground line is placed in each of 1-bit sequences that form the cell array block, thus allowing detection of the occurrence of latch-up for each 1-bit sequence. It is thereby possible to recover the data lost by latch-up just like the error correction by ECC processing that is performed conventionally in the event of soft errors.

The integrated circuit apparatus 1 places the power line and the ground line in each of the 1-bit sequences to detect the occurrence of latch-up for each 1-bit sequence merely because a normal ECC processing often performs 1-bit error detection and recovery. The present invention is not restricted thereto as long as the range that is affected by latch-up is limited to the range where error can be corrected by ECC processing. For example, it is feasible to place a power line and a ground line in every 2-bit sequences by increasing a redundant bit for ECC processing so as to detect the occurrence of latch-up for each 1-bit sequence.

Further, though the detector 203 detects the occurrence of latch-up from a voltage change in the power line and the ground line in the integrated circuit apparatus 1, it is feasible to detect an abnormal current that occurs due to latch-up.

Furthermore, it is feasible to place a detector for detecting a current flowing through the power line VL1 and the ground line GL1 in the event of bit inversion due to soft errors occurring in the 1-bit sequence 201 in addition to the detector 203. If this detector supplies a detection signal to the ECC controller 17 upon detection of soft errors just like the detector 203, it is possible to recover soft errors in addition to the data lost by latch-up.

Second Embodiment

Figure 7:
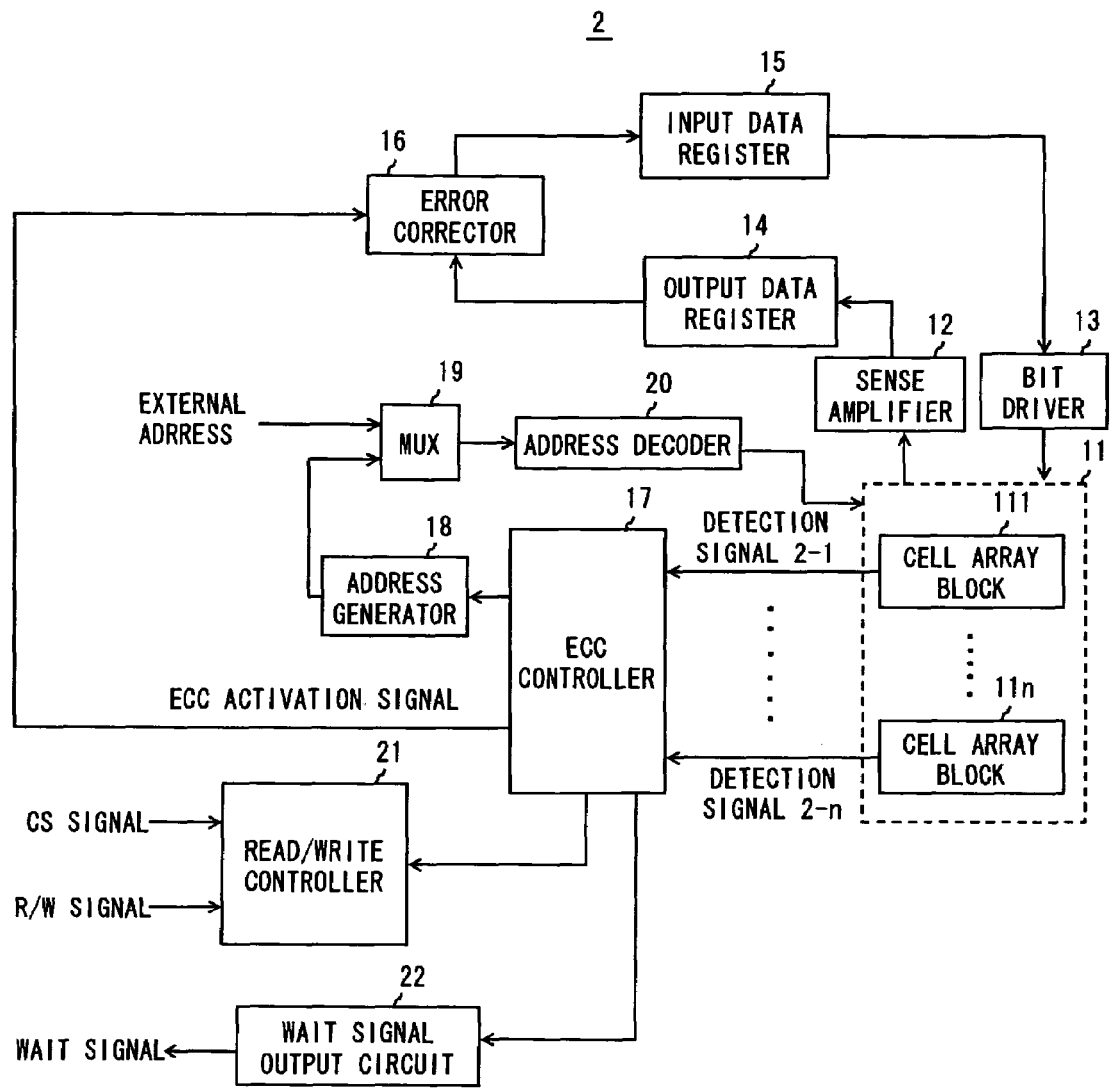
FIG. 7 is a block diagram of an integrated circuit apparatus according an embodiment of the invention.

FIG. 7 shows the configuration of an integrated circuit apparatus 2 according to another embodiment of the present invention. The integrated circuit apparatus 2 is different from the integrated circuit apparatus 1 of the first embodiment in having a WAIT signal output circuit 22. The WAIT signal output circuit 22 supplies a WAIT signal to an external CPU or the like during error correction by ECC processing in order to notify the external CPU or the like that the error correction is currently being performed. The WAIT signal is a signal for indicating an external CPU or the like to wait without memory access.

The timing to output the WAIT signal may be set by indicating the output of the WAIT signal to the WAIT signal output circuit 22 in accordance with the timing when the ECC controller 17 outputs an ECC activation signal to indicate the data recovery to the error corrector 16. The functions of the other components of the integrated circuit apparatus 2 are the same as those in the integrated circuit apparatus 1, and they are thus denoted by the same reference numerals and not described herein.

In this configuration, it is possible to notify an external CPU or the like that error correction is currently being performed so that the external CPU or the like waits without memory access.

Although the case where latch-up occurs in the SRAM cell array 11 is described in detail in the above first and second embodiments, the present invention is not limited to the latch-up or other effects of a parasitic bipolar transistor. The same operation as the detection of latch-up, the elimination of latch-up and the recovery of lost data by ECC processing can be performed also when the present invention is applied to the case where a snap-back effect of MOSFET that is the similar phenomenon thereto occurs.

It is apparent that the present invention is not limited to the above embodiment that may be modified and changed without departing from the scope and spirit of the invention.

What is claimed is:

1. An integrated circuit apparatus comprising:
   a static random access memory (SRAM) cell array including a plurality of memory cells formed of complementary field effect transistors arranged lattice-like;
   a detector detecting a change in a current flowing between a power supply and a ground or a voltage between a power supply and a ground of each 1-bit sequence of the SRAM cell array and outputting a detection signal; and
   a power controller controlling a power supply voltage for each 1-bit sequence, the power controller reducing a power supply voltage supplied to a 1-bit sequence where a change in the current or the voltage is detected by the detector down to a predetermined value according to the detection signal.

2. The integrated circuit apparatus according to claim 1, wherein the detector detects a change in the current or the voltage exceeding a normal operation state of the 1-bit sequence.

3. The integrated circuit apparatus according to claim 1, wherein the predetermined voltage value is higher than 0V and equal to or lower than a maximum voltage value for eliminating an effect of a parasitic bipolar transistor or a snap-back effect that is similar thereto occurring in the 1-bit sequence.

4. The integrated circuit apparatus according to claim 3, wherein the predetermined voltage value is equal to or higher than 0.6V and equal to or lower than 0.9V.

5. The integrated circuit apparatus according to claim 2, further comprising:
an error corrector recovering data that has been retained in the 1-bit sequence and lost due to a change in the current or the voltage exceeding a normal operation state of the 1-bit sequence by error correction processing using an error correction code.

6. The integrated circuit apparatus according to claim 5, wherein a normal read/write operation on the SRAM cell array is suspended during the error correction processing by the error corrector.

7. The integrated circuit apparatus according to claim 5, wherein a WAIT signal for indicating suspension of access to the SRAM cell array is output to outside during recovery of the data that has been retained in the SRAM cell array.

8. The integrated circuit apparatus according to claim 1, wherein the power controller controls a voltage applied to the 1-bit sequence so as to return to a voltage allowing the 1-bit sequence to operate normally after a predetermined time period.

9. The integrated circuit apparatus according to claim 8, wherein the predetermined time period is a time period sufficient to eliminate an effect of a parasitic bipolar transistor or a snap-back effect that is similar thereto occurring in the 1-bit sequence.

10. An integrated circuit apparatus comprising:
a static random access memory (SRAM) cell array including a plurality of memory cells formed of complementary field effect transistors arranged lattice-like;
a power line placed in each 1-bit sequence of the SRAM cell array;
a detector detecting occurrence of an effect of a parasitic bipolar transistor or a snap-back effect that is similar thereto for each 1-bit sequence and outputting a detection signal; and
a power controller controlling a voltage to be supplied to the power line for each 1-bit sequence, the power controller reducing a voltage to be supplied to the power line placed in a 1-bit sequence where the occurrence of an effect of a parasitic bipolar transistor or a snap-back effect that is similar thereto is detected by the detector down to a predetermined value according to the detection signal.

11. The integrated circuit apparatus according to claim 10, wherein the detector detects the occurrence of an effect of a parasitic bipolar transistor or a snap-back effect that is similar thereto in the 1-bit sequence based on a change in a current flowing between a power supply and a ground or a voltage between a power supply and a ground of the 1-bit sequence.

12. The integrated circuit apparatus according to claim 10, further comprising:
an error corrector recovering data that has been retained in the 1-bit sequence and lost due to an effect of a parasitic bipolar transistor or a snap-back effect that is similar thereto by error correction processing using an error correction code.

13. The integrated circuit apparatus according to claim 12, wherein a normal read/write operation on the SRAM cell array is suspended during the error correction processing by the error corrector.

14. The integrated circuit apparatus according to claim 10, wherein a WAIT signal for indicating suspension of access to the SRAM cell array is output to outside during recovery of the data that has been retained in the SRAM cell array.

15. An integrated circuit apparatus comprising:
a static random access memory (SRAM) cell array including a plurality of memory cells formed of complementary field effect transistors arranged lattice-like; and
an error corrector recovering lost data by error correction processing using an error correction code if data retained by the SRAM cell array is lost due to an effect of a parasitic bipolar transistor or a snap-back effect that is similar thereto in the SRAM cell array,
wherein a power is supplied to the memory cells constituting the SRAM cell array so that a range where data retained by the SRAM cell array is lost due to an effect of a parasitic bipolar transistor or a snap-back effect that is similar thereto in the SRAM cell array equals a range where error can be corrected by the error corrector.

16. The integrated circuit apparatus according to claim 15, wherein the SRAM cell array includes a power line placed in each of a predetermined number of bit sequences composed of the memory cells, the predetermined number being set so as to allow error correction by the error corrector if all or part of retained data in the predetermined number of bit sequences is lost.

17. The integrated circuit apparatus according to claim 16, further comprising:
a detector detecting occurrence of an effect of a parasitic bipolar transistor or a snap-back effect that is similar thereto for each of the predetermined number of bit sequences and outputting a detection signal; and
a power controller controlling a voltage to be supplied to the power line for each of the predetermined number of bit sequences, the power controller reducing a voltage to be supplied to the power line placed in a predetermined number of bit sequences where the occurrence of an effect of a parasitic bipolar transistor or a snap-back effect that is similar thereto is detected by the detector down to a predetermined value according to the detection signal.

18. The integrated circuit apparatus according to claim 15, wherein a normal read/write operation on the SRAM cell array is suspended during the error correction processing by the error corrector.

19. The integrated circuit apparatus according to claim 15, wherein a WAIT signal for indicating suspension of access to the SRAM cell array is output to outside during recovery of the data that has been retained in the SRAM cell array.

* * * * *